(12) United States Patent
Ozdemir et al.

(10) Patent No.: US 8,595,582 B2
(45) Date of Patent: Nov. 26, 2013

(54) HIGH-RATE REVERSE-ORDER RUN-LENGTH-LIMITED CODE

(75) Inventors: Hakan C. Ozdemir, Los Gatos, CA (US); Razmik Karabed, San Jose, CA (US); Richard Barndt, La Jolla, CA (US); Kuhong Jeong, Yongin (KR)

(73) Assignee: STMicroelectronics, Inc., Coppell, TX (US)

( * ) Notice: Subject to any disclaimer, the term of this patent is extended or adjusted under 35 U.S.C. 154(b) by 286 days.

(21) Appl. No.: 12/896,613

(22) Filed: Oct. 1, 2010

(65) Prior Publication Data

US 2011/0083054 A1    Apr. 7, 2011

Related U.S. Application Data

(60) Provisional application No. 61/247,854, filed on Oct. 1, 2009.

(51) Int. Cl.
*H03M 13/00*    (2006.01)
(52) U.S. Cl.
USPC .............................. 714/752; 341/58; 341/59
(58) Field of Classification Search
USPC ...................................... 714/752; 341/58–59
See application file for complete search history.

(56) References Cited

U.S. PATENT DOCUMENTS

| | | |
|---|---|---|
| 6,662,338 B1 | 12/2003 | Rezzi et al. |
| 2004/0010748 A1 | 1/2004 | Ozdemir et al. |
| 2004/0010749 A1 | 1/2004 | Ozdemir et al. |
| 2008/0204284 A1* | 8/2008 | Archbold et al. ............... 341/60 |

\* cited by examiner

*Primary Examiner* — Guy Lamarre
(74) *Attorney, Agent, or Firm* — Graybeal Jackson LLP

(57) ABSTRACT

A system and method for encoding a stream of bits with a run-length limited high-rate reverse order encoding schema. According to one embodiment, an RLL encoding block includes a receiver having a precoder operable to receive a stream of N-bits having symbols of M-bits in length, a histogram operable to identify an index symbol of M-bits that does not occur within the received stream of N-bits. It is this index symbol that may be used as the key to encoding a block of symbols so as to ensure unique decodability when RLL decoding. Finally, an encoder operable to perform an exclusive-or operation on each symbol with the next symbol stored in the stream. Such an encoding system only adds one symbol of M bits in length to a block of N bits and still results in a stream of bits sufficient to support high-rate requirements and strict timing loop control.

18 Claims, 4 Drawing Sheets

US 8,595,582 B2

HIGH-RATE REVERSE-ORDER RUN-LENGTH-LIMITED CODE

PRIORITY CLAIM TO PROVISIONAL PATENT APPLICATION

This patent application claims priority to U.S. Provisional Patent Application No. 61/247,854 entitled 'A HIGH-RATE REVERSE-ORDER RUN LENGTH LIMITED CODE' filed on Oct. 1, 2009 and is hereby incorporated by reference.

BACKGROUND

A data-communications system, such as a computer disk drive or a cell phone, typically includes a read/write channel, which recovers data from a received read signal (sometimes called a data signal) by interpreting a stream of bits. Similarly, during a write data cycle, the read/write channel encodes data to a write signal or transmit signal. Such systems may read and write data to and from storage mediums and/or communication channels at ever-increasing rates. With the increase in data throughput, software and hardware may need to be more and more resilient to noise-induced errors and any encoding schemas need to be more and more efficient. Thus, many communication and computer systems employ various coding techniques that may be implemented to limit errors that may arise.

One particular coding technique may be referred to as modulation or constrained coding. Modulation coding may refer, generally, to encoding a data stream to meet a constraint, such as limiting the number of consecutive ones or zeroes in a binary stream of bits. One particular example of modulation coding is run-length-limited (RLL) coding. RLL coding adds redundancy and may be used to ensure that timing information is present in the data stream when the data stream is received (in the case of data transmission) or retrieved (in the case of data storage). A data stream in its analog form generally includes a series of pulses, e.g., electrical voltage pulses, which may represent a transition from a logical one to a logical zero or vice versa. RLL coding provides timing recoverability by encoding the data stream such that the number of consecutive logical zeros in the data stream is limited to a desired maximum number, or k-constraint. The k-constraint ensures that the space between pulses is not too long, and thereby provides timing recoverability because the space between pulses does not carry any timing information. However, ever-increasing requirements for performance parameters require that the RLL coding be implemented at higher and higher rates.

BRIEF DESCRIPTION OF THE DRAWINGS

Embodiments of the subject matter disclosed herein will become more readily appreciated as the same become better understood by reference to the following detailed description, when taken in conjunction with the accompanying drawings.

DETAILED DESCRIPTION

Figure 1:
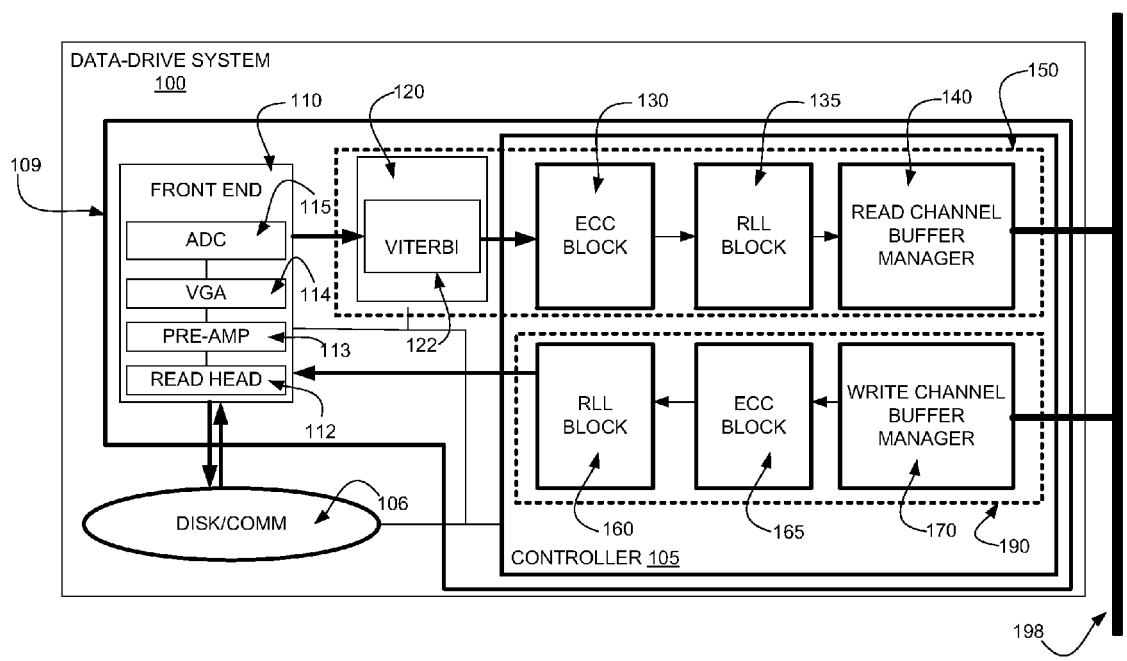
FIG. 1 is a block diagram of an embodiment of a data-drive system having a read/write channel with improved RLL coding.

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

As discussed briefly above, data-drive systems and communications system use run-length-limited encoding and decoding to assist with transmission of data. Run-length-limited or RLL coding is a line coding technique that may be used to send arbitrary data over a communications channel having bandwidth limits. Such an encoding technique may be used in both telecommunication and storage systems which move a medium past a fixed head. In today's technology, the nature in which data is read from a medium or received from a communications channel may be briefly described as interpreting an analog signal from a read head at specific intervals of time as either a high-logic value (e.g., a "1") or a low-logic value (e.g., a "0"). Thus, during stretches of bits wherein all of the bits are logic-1 or all of the bits are logic-0, without a basis for comparison when the signal changes, specific data reading problems may occur. As a result, RLL coding is designed to limit the length of stretches (runs) of repeated bits during which the signal does not change. If the runs are too long clock recovery is difficult, while if they are too short, the high frequencies (of the quasi-oscillating read signal) might be attenuated by the communications channel.

As but one simple example, when a stream of bits is to be encoded, every logic-1 bit may be expanded to be encoded as three bits of "101" and every logic-0 bit may be expanded to be encoded as "010." Thus, by modulating the data (e.g., ensuring that a transition of one-to-zero or zero-to-one occurs frequently, RLL coding reduces the timing uncertainty in decoding the stored data which would lead to the possible errant insertion or removal of bits when reading the data back.

For example, in a computer system having a hard-disk drive (for a data storage signal) or receiver (for a communications signal), when the computer system writes data to or reads data from the disk or channel, the data may be RLL encoded or decoded. In specific, during a write data process, actual data may be encoded with a specific RLL encoding schema to limit the run length of any portion of the underlying data. When this data is read out, the RLL-encoded data may be decoded back into the underlying data. However, the specific manner in which particular RLL coding schemas are used lead to specific drawbacks. In the above example of encoding three bits of code for every one bit of data, the actual written or transmitted data stream is necessarily three times as long as the original stream of data. Thus, an effective RLL coding schema adds as few bits as possible to the bit stream while ensuring data readability and unique encoding capable of being effectively decoded when the data stream is read or received. Such an effective RLL coding schema is discussed in the remainder of the detailed description with reference to FIGS. 1-7.

Prior to discussing the figures and by way of initial overview, a summary of the subject matter disclosed herein is presented. Generally speaking, the subject matter discussed herein is related to a system and method suited to provide a high-rate (e.g., efficient) RLL coding schema for a read/write channel of a data-drive system of communications channel. The high-rate RLL coding adds a minimal amount of extraneous data to a block of data when encoding. Thus, when stored or transmitted, a small amount of extraneous data is needed to still maintain a data stream that is capable of maintaining timing and continuity when received or read back out. According to one embodiment, an RLL encoding block includes a receiver having a precoder operable to receive a stream of N-bits having symbols of M-bits in length, a first-in-first-out (FIFO) memory operable to store each symbol in the received stream of N-bits, a histogram operable to identify an index symbol of M-bits that does not occur within the received stream of N-bits. It is this index symbol that may be used as the key to encoding a block of symbols so as to ensure unique decodability when RLL decoding. Finally, an encoder operable to perform an exclusive-or operation on each symbol stored in the memory with the next symbol stored in the memory wherein the first operation comprises an exclusive-or operation between the first symbol in the memory and the index symbol to produce a modified stream of M plus N bits. Such an encoding system only adds one symbol of M bits in length to a block of N bits and still results in a stream of bits sufficient to support high-rate requirements and strict timing loop control. These and other aspects and advantages are discussed in greater detail beginning with the data-drive system of FIG. 1.

FIG. 1 is a block diagram of a data-drive system 100 according to an embodiment of the subject matter disclosed herein. Such a data-drive system 100 may read data from a hard disk 106 or write data to the hard disk. Of course, in a communication system, this component may also be a communication transmit channel 106. For the purposes of RLL encoding or decoding, only the write operation of the data-drive 100 is discussed for the time being. A discussion of the read process is presented further below. It is also understood by the skilled artisan that such a description of the processes discussed herein applied equally to data transmitted to a communication network (similar to a write process) and received from a communication network (similar to a read process).

Generally speaking, the data-drive 100 may include a read/write channel 109 that may write data to or read data from a disk 106. The read write channel generally includes a separate write channel 190 and a separate read channel 150. Generally, when conducting a write data process, data may be sent to the controller 105 from a system bus 198 and queued in a write channel buffer manager 170 before being passed to an error-code-correction (ECC) block 165 and then passed through an RLL encoding block 160. Encoding with ECC prior to encoding with RLL is called reverse order encoding as the order of the decoding procedure is reversed when reading out or receiving a transmitted signal (e.g., ECC decode then RLL decode). ECC encoding is not discussed in detail herein and the RLL encoding is discussed in greater detail below. Once RLL-encoded and ECC-encoded, the data may be written to the hard disk 106 via a front-end 110.

Generally speaking, data to be written to the disk 106 may be stored and processed in groupings of eight or ten bits (or other suitable grouping numbers) depending on the encoding schema being employed. A grouping of bits may be referred to as a symbol (e.g., an eight-bit or ten-bit grouping) wherein a sector of data (comprising 512 bytes of data, for example) may include approximately 410 symbols. Thus, for RLL encoding, bits are handled in symbol-size groupings of 8, 10, or other suitable size of bits.

Each of these components may be controlled by a local data-drive controller 105. Further, a skilled artisan will understand that these components (with the exception of the disk 106) may be disposed on a single integrated circuit die, individual integrated circuit dies or any combination of dies thereof. Only the RLL encoding block 160 will discussed in greater detail further below with respect to FIGS. 2-6. However, prior to the specific discussion of the RLL encoding process, the remainder of the block diagram of FIG. 1 is discussed with respect to a read process.

When data is to be read from the disk 106, the read/write head 112 that is part of the front end 110 interprets signals detected on the disk 106 to produce a stream of bits to be sent to a read data path. The front end 110 may include amplification and processing circuitry that assists with reading of data stored on the disk 106. Such circuitry may include pre-amplifier 113, a variable-gain amplifier (VGA) 114, and an analog-to-digital converter (ADC) 115. The read head 112 and pre-amplifier 113 convert the data stored on the disk 106 into an analog read signal, and the VGA 114 adjusts the amplitude of the analog read signal to a predetermined value or range of values deemed suitable for the subsequent components of the read circuit 120. The ADC 115 samples the gain-adjusted analog read signal and converts the analog read signal into a digital read signal that may then be passed to the read circuit 120.

The read circuit 120 then interprets signals from the front end 110 on a bit-by-bit basis to reconstruct the symbols of the codeword. One component for accomplishing this interpretation is a Viterbi detector 122. The Viterbi detector 122 processes the sampled digital read signal to produce a signal comprising a stream of bits having definitive logical values representing "1" or "0". An example of a Viterbi detector that may be the same as or similar to the Viterbi detector 122 is disclosed in U.S. Pat. No. 6,662,338 and U.S. Publication Nos. 2004/0010749 and 2004/0010748, which are incorporated by reference. The read circuit 120 includes several data processing components such as filters and the like (not all are shown) for processing and interpreting the read signal.

Once a digital stream of bits is established from the Viterbi detector 122, the ECC-encoding is decoded and any error-correction that is necessary is accomplished at the ECC block 130 of the read channel 150. After ECC decoding, the bit stream is passed to the RLL decode block 135 in blocks of a suitable amount of bits (e.g., 4096 bits, 2048 bits, etc.). Finally, once RLL decoded (discussed further below), the original data is passed to a read channel buffer manager 140 before being passed to a system bus 198 for use in the overall system. With such a data-drive system (or alternatively a communication transmitter/receiver), the RLL encoding and decoding may be accomplished in the write channel RLL encoding block as discussed with respect to FIGS. 2-6.

Figure 2:
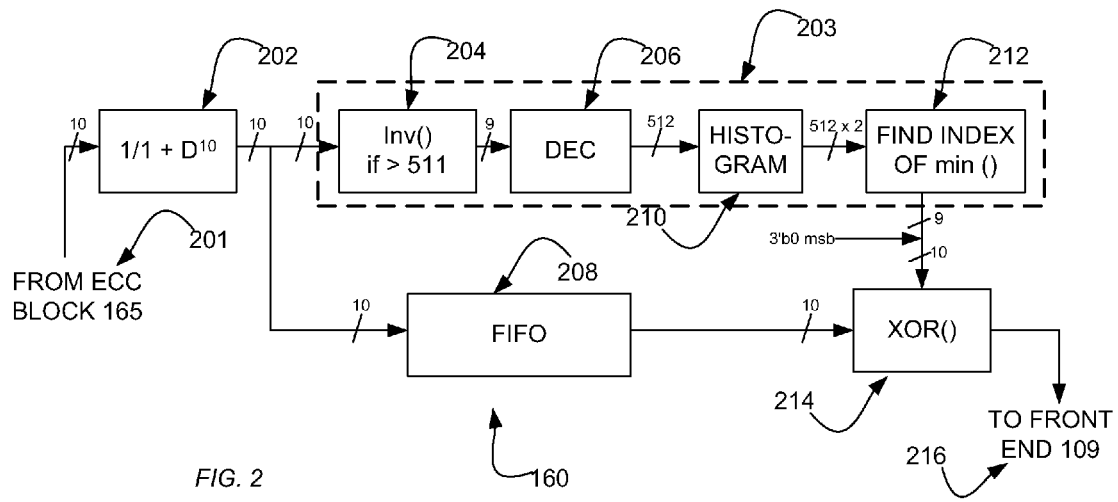
FIG. 2 is a block diagram of an embodiment of a RLL encoding block for four kilobyte data blocks that may be part of the controller of FIG. 1.
Figure 3:
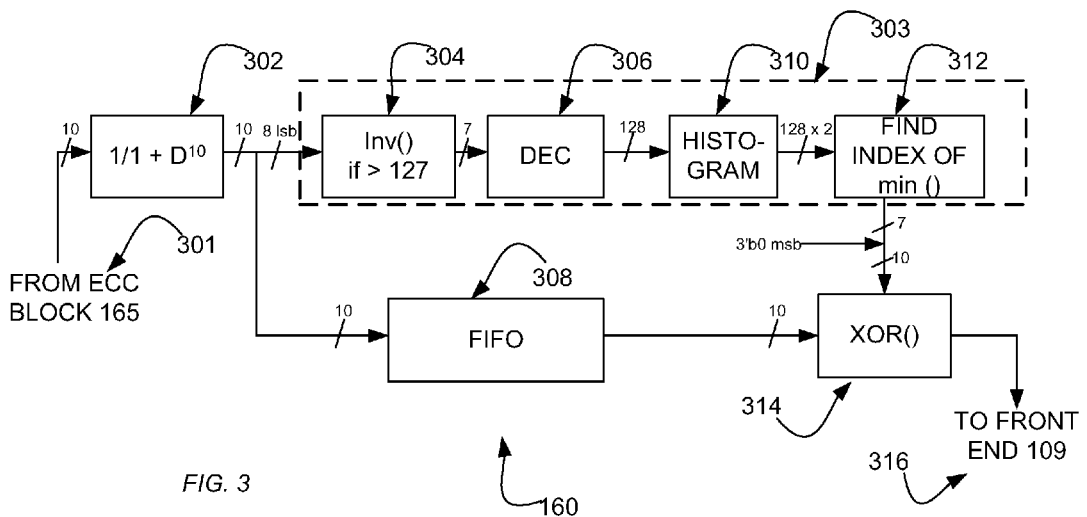
FIG. 3 is a block diagram of an embodiment of a RLL encoding block for two kilobyte data blocks that may be part of the controller of FIG. 1.

FIGS. 2 and 3 are block diagrams of embodiments of the RLL block 160 of FIG. 1. FIG. 2 is a block diagram for a 4096 (4K) bit block code embodiment that may be implemented using 10-bit symbols and FIG. 3 is a block diagram for a 2048 (2K) bit block code embodiment that may be implemented using 8-bit symbols. As discussed above, the RLL encoding schema is directed at eliminating long runs of ones or zeroes in a bit stream as long runs of the same logical bit are difficult for a timing and recovery circuit to maintain timing as there are no transitions by which the circuit can measure for a basis of its very timing. In essence, logical transitions help the timing loop lock its measurement time by providing feedback control based upon the detection of a transition.

In a typical worst case, the run-length of continuous zeroes (or ones) can be equal to 239 bits in certain coding schemas. In this worst-case then, a timing circuit would need to maintain precise measurement at 239 consecutive intervals without slipping forward or backward until it sees a transition in which proper feedback information may be gleaned. As read/write channels are required to operate at worst-case signal-to-noise conditions, iterative detection schemas in read/write channels may provide for sufficiently low sector-failure rate under worst-case conditions. Timing loops can rarely recover from a loss-of-lock condition; even if the timing loop does recover, it is very likely that a bit-slip will be present in the recovered data. Typically, the only way sector data can be recovered after such an event is by error-code correction (ECC), provided that the event is contained towards the end of the sector such that the number of corrupted symbols does not exceed the correction capability of the ECC. Even then, it is quite likely that the errors will be too great in number even for ECC. Thus, providing a bit stream with limited runs of ones or zeroes helps to keep errors lower by keeping timing loops locked in. As discussed in more detail below, the RLL coding schema not only provides more transitions for the timing loop to reduce the probability of the loss-of-lock events, but also satisfies a high rate requirement of various hard disk manufacturers.

Turning to the specific blocks of FIG. 2 (the 4K block code embodiment), a write data process is described in greater detail. At first, stream of bits may be received at the RLL block 160 as a non-return to zero (NRZ) stream of bits at an RLL block input 201. That is, an NRZ data stream shows transitions from a zero-to-one (or vice versa as a logic one and non-transitions as a logic zero. The stream of bits may be received from ECC block 165 after being appended and modified with ECC data. As the bit stream is received, the NRZ data is precoded with a $1/1+D^{10}$ type precoder within a receiver 202. The purpose of the precoder is to provide a bit stream of 10-bit symbols to the FIFO buffer 208 (First-In-First-Out) so that when the key-symbol is identified, the original stream of bits may be easily encoded and decoded according to the RLL coding schema. The output of the precoder 202 is reset to 10'b0, and this is prepended to the beginning of the FIFO 208. The precoder block 202 is shown in greater detail in FIG. 4.

Figure 4:
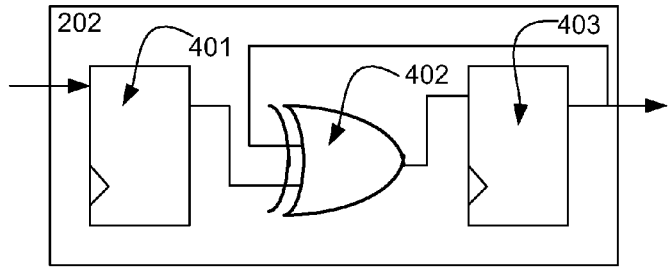
FIG. 4 is a schematic diagram of an embodiment of a precoder block of the RLL encoding block of FIG. 2 or 3.

Thus, turning attention to FIG. 4 for the moment, a precoder block 202 is shown as a logic block implementation. In specific, each bit received is received at an initial D-type flip flop 401 that is clocked by a controller clock (not shown). The output of the initial D-type flip-flop 401 is coupled to one input of an XOR gate 403. The other input of the XOR gate 402 is a feedback input from an output of a second D-type flip-flop 403 (also clocked by the controller clock). Thus, the output of the XOR gate (which feeds the second D-type flip-flop 403) is a $1/1+D^{10}$ XOR precoder wherein each bit is XOR'ed with the previous bit.

In terms of coding, the following code snippet shows one embodiment of the algorithm denoting the XOR( )operation:

```
rll1_buffer[0] = 10'b00_0000_0000;
for (i=1;i<=block_length;i=i+1) begin
rll1_buffer[i]=block_buffer[i-1] ^ rll1_buffer[i-1];
end
```

Turning back to FIG. 2, the precoder 202 output is also coupled to a sorting circuit or histogram circuit 203 that includes four logical blocks (an inverter block 204, and decimator block 206, a histogram 210, and an index identifier block 212) for determining a 10-bit symbol in a bit stream block (in this embodiment a 4K block) with the lowest rate of occurrence. Since each 10-bit symbol in the bit stream will be XOR'ed when stored, one may take advantage of the fact that each 10-bit symbol and its complement will yield the same result from the final XOR encoder block 214. Thus, the degree of the histogram search may be reduced by 1-bit by complementing any symbol that is above binary 511. That is, any binary 10-bit word above 511 (half of 1024 possible 10-bit combinations) may be complemented to be below 511 and therefore, in effect, the histogram need only find the minimum occurrence of a 9-bit word.

Next the decoder block 206 activates exactly one of its outputs, corresponding to its current 9-bit input. Then, the associated output line from the decoder block 206 increments a related bin in the histogram block 210. The histogram block 210 in this 10-bit embodiment includes 512 different bins in which an occurrence of each respective 10-bit symbol will increment an associated counter of each bin by one. Sorting is done with an address decoding circuit. For a 4K block code, it is a mathematical certainty that at least one 10-bit symbol will not occur anywhere in the 4K stream of bits. Thus, the histogram 210 is designed to identify at least one 10-bit symbol that does not occur and to use the identified 10-bit symbol as the index symbol. This process is referred to as a find(min( )) operation and is shown in logical block form in FIG. 5.

Figure 5:
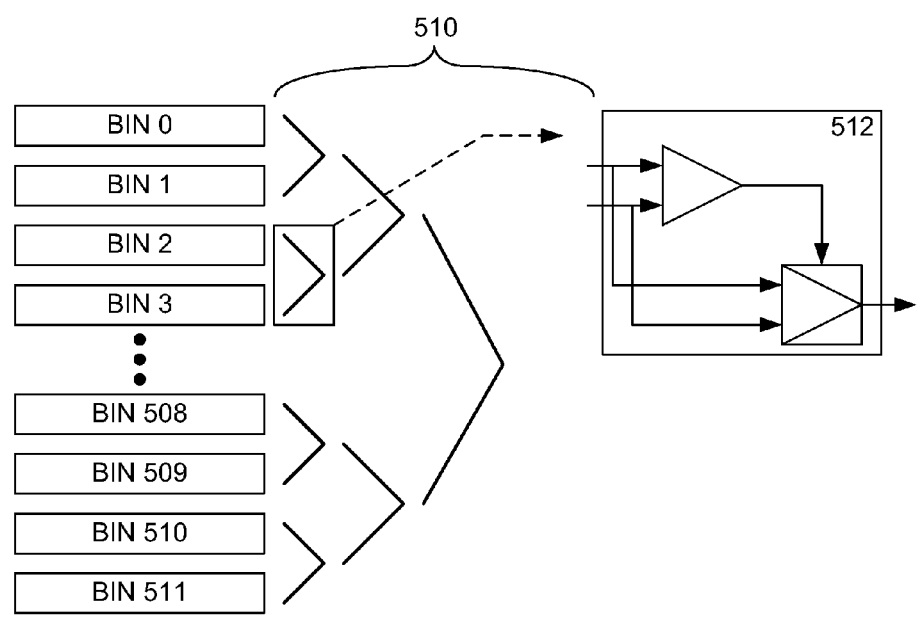
FIG. 5 is a schematic diagram of an embodiment of a histogram circuit of the RLL encoding block of FIG. 2 or 3.

Turning attention to FIG. 5, the histogram 210 is shown in greater detail. Here, each 10-bit symbol bin (bin 0 through bin 511) is shown on the left-hand side of the diagram. As each bin is populated, a set of cascading comparators (e.g., several logical sorting blocks 510—also called Comparator-Selector (CS) units) will compare two adjacent bins (for example bin 0 with bin 1, bin 2, with bin 3, and so on). The particular bin that exhibits a smaller count logically passes to the next comparison level. This may be accomplished by using a sorting circuit 510 that includes nested CS units 512 that yield results as shown in the blown-up section of FIG. 5. Such CS units 512 may be initialized as follows:

for (i=0;i<=511;i=i+1) symbol_bin[i]=0

Continuing the example, bin 0 may have zero occurrences and bin 1 may have a single occurrence, thereby allowing bin 0 to be passed and compared to the least-occurrence comparison of bins 2 and 3. Eventually, at least one bin is identified as having zero occurrences in the 4K block. One or more of these identified 10-bit symbols may then be considered the index symbol.

For the 4K block embodiment as shown in FIG. 2, finding the minimum, e.g., the index-symbol for the 4K block code that exhibits a zero-occurrence, requires 256+128+127 (for a total of 511) 1-bit CS units 512. As compared to other embodiments (such as the 2K block embodiment described further below with respect to FIG. 3) the fan-in may be larger, but the implementation simplicity of 1-bit CS units 512 and pipeline-computations can make the find(min( )) operation more efficient for the 4K block code. Thus, a smaller CS-tree for 128 bins with 63 CS units can be used four times. The histogram feeds the find(min( )) operation code block 212. Thus, one embodiment of code for the find(min( )) operation block 212 comprises:

```
min_index = 0;
min = 2;
for (i=0;i<512;i=i+1) begin
  min_index = symbol_bin[i] < min ? i : min_index;
  min = symbol_bin[i] < min ? symbol_bin[i] : min;
end
```

Turning to the final block of FIG. 2, an encoder 214 provides an XOR logic block for combining the index symbol and iterative follow-on symbols with the symbols stored in the FIFO 208. This XOR encoder block 214 adds (mod 2) the index (of the bin) to the precoded NRZ symbols (as fed from the FIFO 208). In this manner, the entire 4K code block is appended with a first index-symbol as the index key for decoding the block. Then, every next block is XOR'ed with the previous block. Then, when this RLL-encoded data stream is received or read out, the first ten-bit symbol is interpreted as the index symbol for decoding the rest of the block. That is, the index symbol is XOR'ed out and then every next symbol is XOR'ed out of the previous symbol in the stream of bits. Thus, only 10 bits per 4K block is added as superfluous information not directly related to usable data. One embodiment of code for the encode operation comprises:

```
for (i=1;0<block_len;i=i+1) begin
  rll1_out = rll1_buffer[i] ^ min_index;
end
```

Because the index symbol is unique with respect to all of the other symbols in the 4K block, it necessarily follows that at most a length of 18 bits may consecutively be zero. That is, for this embodiment, the k-constraint is 18. The only time that a run-length of 18 occurs is when the one symbol that XOR's with the index symbol (or previous symbol if not the first time in the iterative process) producing a 10-bit symbol of "1000000000" is immediately followed by the one symbol that XOR's with immediate previous symbol to produce a symbol of "0000000001." Of course, since the index symbol is unique, there is no symbol that XOR's in the stream to produce all zeroes in one symbol.

Turning attention back to FIG. 1, the RLL block 130 of the read channel 150 then comprises a simple $1+D^{10}$ circuit that XOR's out the encoding by seeding the process with the prepended index symbol. The prepended 10-bit index symbol are used for this operation, and then discarded. One embodiment of code for the decode operation comprises:

```
for (i=1;i<block_len;i=i+1) begin
  nrz_out = rll1_buffer[i] ^ rll1_buffer[i-1];
end
```

Figure 6:
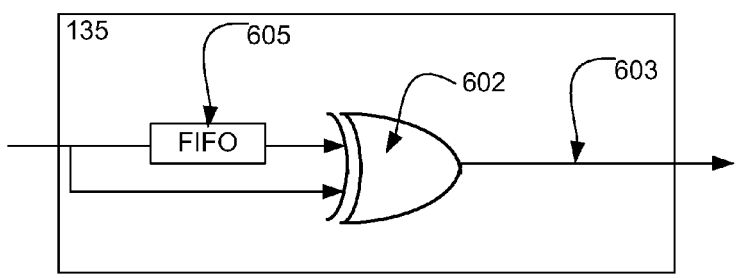
FIG. 6 is a schematic diagram of an embodiment of a decoder block of the controller of FIG. 1.

Such a decode block may be implemented in logical form as shown in FIG. 6. FIG. 6 is a schematic diagram of an embodiment of an RLL decoder block 135 of the controller of FIG. 1. The decode block 135 may include a FIFO 605 for shifting the input to the XOR gate by one 10-bit symbol. Thus, the first symbol received by the XOR gate on the bottom input will be the index symbol prepended to the block of bits. Then after a delay through the FIFO 605, the next iteration of decoding XOR's the index symbol with the next symbol. Then the first symbol is XOR'ed with the second symbol and so on until the entire block is decoded on output 603 that feeds the read channel buffer 140.

High rate codes, that is, codes that produce blocks of code with a small increase in overall bit count, are desirable for their efficiency. To avoid adversely affecting the rate of transmission, it is desirable to encode long data sequences with high rate codes. However, there is a trade-off between efficiency and the complexities associated with manipulating the large sequence of data bits into correspondingly wide code words. Further, code complexities may increase when k-constraints must be considered. In this 4K embodiment, only 10 bits of extraneous data is added to a block of 4096 bits while still ensuring a k-constraint of 18.

The description of the 4K code block as detailed above may also be similar to a 2K code block embodiment. FIG. 3 is a block diagram of an embodiment of a run-length-limited (RLL) encoding block for two kilobit (2K) data blocks that may be part of the controller of FIG. 1. As before, the bit stream is received at a receiver having a precoder 302 initially in 10-bit symbols and passed along to a FIFO 308 in a similar manner as described above. However, as the 10-bit symbols are passed to the histogram circuit 303 (which includes an inverter block 304, a decimator block 306, a the histogram 310, and an index identifier circuit 312), the 10-bit symbol is reduced to the 8 least significant bits (LSB) for determining an 8-bit symbol in a bit stream block with the lowest rate of occurrence. Since each 8-bit symbol in the bit stream will be XOR'ed when stored (as before), one may take advantage of the fact that each 8-bit symbol and its complement will yield the same result from the final XOR block 314. Thus, the degree of the histogram search may be reduced by 1-bit, again, by complementing any symbol that is above binary 127 in this embodiment. That is, any binary 8-bit word above 127 (half of 256 possible 8-bit combinations) may be complemented to be below 127 and therefore, in effect, the histogram need only find the minimum occurrence of a 7-bit word.

The comparator tree of the 2K block code has 128 2-bit inputs. The selection of the minimum for this block code requires 64+32+16+8+4+2+1=127 2-bit CS units. This hardware can be simplified by pipelining the operation and using a smaller tree multiple times. For example a smaller compare-select tree for 32 bins with 15 CS units can be used four times. Finding the Minimum 8 for (i=0;i<=block_length;i=i+1) may be coded in this embodiment as:

```
index = rll1_buffer[i];
index = index[9] ? !index + 1: index;
symbol_bin[index] = symbol_bin[index] <2 ? symbol_bin[index]+1 : 2;
end
```

In this 2K block example, there exists a possibility that every eight-bit sequence of bits is found in one 2048 bit block. Thus, the minimum occurrence of an index symbol may be one (as opposed to zero with the 4K block embodiment described above). As before, the index symbol (in this embodiment an 8-bit symbol) is XOR'ed with the contents of the FIFO 308 in the encode block 314 of the 2K embodiment to yield an encoded bit stream with only 8 additional bits added per 2048 bits of usable data. However, the k-constraint here is 26 bits because the possibility does exist that the one occurrence of the index symbol causes at least one symbol to XOR to all zeroes and if the immediate prior and immediate subsequent symbols are XOR'ed as described above, the 26 consecutive zeroes may occur. This is still better than the conventional k-constraint of 239 initially described.

Figure 7:
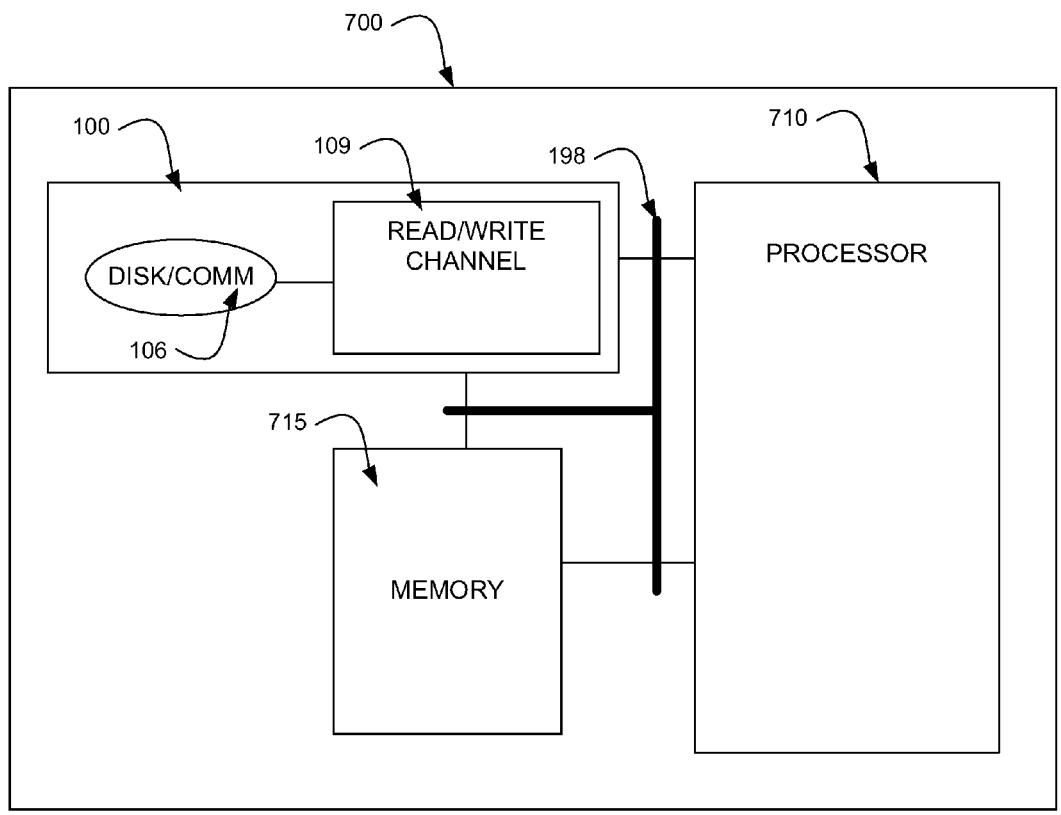
FIG. 7 is a block diagram of an embodiment of a computer system that may include the data drive of FIG. 1 and the RLL block of FIGS. 2 and/or 3.

FIG. 7 is a block diagram of an embodiment of a computer system 700 that may implement the data-drive system 100 of FIG. 1 and the RLL blocks as shown in FIGS. 2 and 3. In this system embodiment, the system 700 may include a processor 710 coupled to a local memory 715 and coupled to the data-drive system 100 via the system bus 198. As can be seen, the data-drive system 100 includes a hard disk/communication channel 106. The processor 710 may be operable to control the memory 715 and the data-drive system 100 in transferring data to and from the disk 106 and to and from the memory 715. Further, additional data stores and communication channels (not shown) may be used to transfer data to and from the data-drive system 100 that may be remote from this computer system 700.

Such a computer system may be any number of devices including a CD player, a DVD player, a Blu-Ray player, a personal computer, a server computer, a smart phone, a wireless personal device, a personal audio player, media storage and delivery system or any other system that may read and write data to and from a storage medium or communication channel.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. An encoder, comprising:
   a receiver configured to receive a stream of bits;
   a sorter configured to determine a unique sequence of bits that is not present in the stream of bits; and
   a combiner configured to combine the unique sequence of bits with the stream of bits.

2. The encoder of claim 1, wherein the stream of bits comprises 4096 bits and the unique sequence of bits comprises ten bits.

3. The encoder of claim 1, wherein the stream of bits comprises 2048 bits and the unique sequence of bits comprises eight bits.

4. The encoder of claim 1, wherein the sorter comprises a histogram circuit having:
   a comparator configured to compare a sequence of bits with a pre-determined threshold number;
   a complementor block configured to complement the sequence of bits if the comparator determines that the sequence of bits exceeds the threshold value;
   a plurality of bins, each bin associated with a unique combination of bits in the sequence of bits; each bin configured to be incremented at the occurrence of its associated sequence within the stream of bits; and
   a logic matrix configured to determine at least one bin that is not incremented.

5. The encoder of claim 1 wherein the combiner further comprises an exclusive-or logic block.

6. The encoder of claim 1, further comprising a precoder including an exclusive-or logic block configured to receive the stream of bits from the receiver.

7. A run-length limited encoding block, comprising:
   a precoder configured to receive a stream of N-bits having symbols of M-bits in length, the precoder configured to perform an exclusive-or logic operation on each symbol in the bit stream;
   a first-in-first-out memory configured to store each symbol in the received stream of N-bits;
   a histogram configured to determine an index symbol of M-bits that does not occur within the received stream of N-bits; and
   an encoder configured to perform an exclusive-or operation on each symbol stored in the memory with the next symbol stored in the memory wherein the first operation comprises an exclusive-or operation between the first symbol in the memory and the index symbol to produce a modified stream of M plus N bits.

8. The run-length-limited encoding block of claim 7 wherein the histogram further comprises:
   a comparator configured to compare a sequence of bits with a pre-determined threshold number;
   a complementor block configured to complement the sequence of bits if the comparator determines that the sequence of bits exceeds the threshold value;
   a plurality of bins, each bin associated with a unique combination of bits in the sequence of bits; each bin configured to be incremented at the occurrence of its associated sequence within the stream of bits; and
   a logic matrix configured to determine at least one bin that is not incremented.

9. The run-length-limited encoding block of claim 7 wherein M comprises 4096 bits and N comprises 10 bits.

10. The run-length-limited encoding block of claim 9 wherein the modified stream of M plus N bits comprises a run length no greater than 26 bits.

11. The run-length-limited encoding block of claim 9 wherein the modified stream of M plus N bits comprises a run length no greater than 18 bits.

12. The run-length-limited encoding block of claim 7 wherein M comprises 2048 bits and N comprises 8 bits.

13. A controller, comprising:
   a write channel, having:
      a write-channel buffer configured to receive a stream of bits to be sent to a write channel;
      a write-channel ECC-block configured to encode the stream of bits from the buffer with an error-code schema; and
      a write-channel RLL-block configured to determine a unique sequence of bits that is not present in the stream of bits and configured to combine the unique sequence of bits with the stream of bits.

14. The controller of claim 13, further comprising a single integrated circuit die.

15. The controller of claim 13, further comprising multiple integrated circuit dies.

16. The controller of claim 13, further comprising:
   a read channel, having:
   a read-channel ECC-block configured to decode the stream of bits after being read from a communication channel; and
   a read-channel RLL-block configured to decode the stream of bits from the ECC-block by using the unique sequence of bits; and
   a read-channel buffer configured to receive a stream of bits to be sent to a coupled communication bus.

17. A write channel, comprising:
   a buffer configured to buffer an input stream of symbols; and
   a run-length-limiting block configured;
      to determine a symbol that is not present in the stream of symbols, and
      to combine the symbol with the buffered stream of symbols.

18. A method, the method comprising:
   receiving a stream of symbols;

determining an index symbol that does not occur in the stream of symbols;
encoding the stream of symbols by logically operating on at least a portion of the stream of symbols; and
appending the index symbol to the encoded stream of symbols.

* * * * *